United States Patent
Chun et al.

(10) Patent No.: US 7,091,758 B2
(45) Date of Patent: Aug. 15, 2006

(54) POWER-ON RESET CIRCUIT, SEMICONDUCTOR INTEGRATED CIRCUIT DEVICE INCLUDING THE SAME AND METHOD FOR GENERATING A POWER-ON RESET SIGNAL

(75) Inventors: Ki-Chul Chun, Suwon-si (KR); Jae-Yoon Sim, Suwon-si (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 96 days.

(21) Appl. No.: 10/834,851

(22) Filed: Apr. 30, 2004

(65) Prior Publication Data

US 2005/0035796 A1 Feb. 17, 2005

(30) Foreign Application Priority Data

May 2, 2003 (KR) ...................... 10-2003-0028289

(51) Int. Cl.
*H03K 17/22* (2006.01)
(52) U.S. Cl. ....................... 327/143; 327/198
(58) Field of Classification Search ...................... None
See application file for complete search history.

(56) References Cited

U.S. PATENT DOCUMENTS

| | | | |
|---|---|---|---|
| 4,611,126 A * | 9/1986 | Miller | 307/64 |
| 4,788,462 A | 11/1988 | Vesce et al. | 327/546 |
| 5,471,130 A | 11/1995 | Agiman | 323/303 |
| 5,519,347 A | 5/1996 | Kim | 327/143 |
| 6,181,173 B1 * | 1/2001 | Homol et al. | 327/143 |
| 6,204,703 B1 | 3/2001 | Kwon | 327/143 |
| 6,236,249 B1 | 5/2001 | Choi et al. | 327/143 |
| 6,346,834 B1 | 2/2002 | Chai | 327/143 |
| 6,362,669 B1 * | 3/2002 | Zhou et al. | 327/143 |
| 6,528,978 B1 | 3/2003 | Lim | 323/313 |
| 6,737,884 B1 * | 5/2004 | Shigemasa et al. | 326/38 |
| 2005/0073341 A1 * | 4/2005 | Lim | 327/143 |

FOREIGN PATENT DOCUMENTS

| | | |
|---|---|---|
| KR | 1998-69158 | 10/1998 |
| KR | 2001-44892 | 6/2001 |
| KR | 1020020031843 | 5/2002 |

OTHER PUBLICATIONS

Korean Office Action dated Jun. 30, 2005 w/ Translation.

* cited by examiner

*Primary Examiner*—Timothy P. Callahan
*Assistant Examiner*—Terry L. Englund
(74) *Attorney, Agent, or Firm*—Harness, Dickey & Pierce, P.L.C.

(57) ABSTRACT

A semiconductor integrated circuit may include an internal circuit, and a power-on reset circuit for generating a power-on reset signal to initialize the internal circuit at a power-on. At the power-on, the power-on reset circuit delays a transition of the power-on reset signal from a first level to a second level until a given time duration after the power supply voltage reaches a detection voltage.

17 Claims, 4 Drawing Sheets

POWER-ON RESET CIRCUIT, SEMICONDUCTOR INTEGRATED CIRCUIT DEVICE INCLUDING THE SAME AND METHOD FOR GENERATING A POWER-ON RESET SIGNAL

PRIORITY STATEMENT

This U.S. nonprovisional application claims priority under 35 U.S.C. §119 to Korean Patent Application No. 2003-28289, filed May 2, 2003, the contents of which are incorporated by reference in its entirety.

BACKGROUND OF THE INVENTION

1. Field of the Invention

The present invention generally relates to semiconductor devices, to power-on reset circuits for initializing an internal circuit of the integrated circuit device, and to a method of generating a power-on rest signal.

2. Description of Related Art

Power-on reset circuits (commonly referred to as "power-up detector circuits") provide a reset signal for initializing flip-flops, latches, counters and other internal elements of a device such as a semiconductor integrated circuit when a power supply voltage is applied thereto. The reset signal is maintained at a first voltage (e.g., a logic "low" or "0") at a given time sufficient for stabilizing each element in the semiconductor integrated circuit. After a given time elapses, the reset signal is inverted to a second voltage (e.g., a logic "high" or "1") while the power supply voltage is applied to the semiconductor integrated circuit.

Various power-on reset circuits are disclosed in U.S. Pat. No. 4,788,462, entitled "POWER-ON-RESET (POR) CIRCUIT", in U.S. Pat. No. 5,471,130, entitled "POWER SUPPLY CONTROLLER HAVING LOW STARTUP CURRENT", in U.S. Pat. No. 5,519,347, entitled "START-UP CIRCUIT FOR STABLE POWER-ON OF SEMICONDUCTOR MEMORY DEVICE", in U.S. Pat. No. 6,204,703, entitled "POWER ON RESET CIRCUIT WITH POWER NOISE IMMUNITY", in U.S. Pat. No. 6,236,249, entitled "POWER-ON RESET CIRCUIT FOR A HIGH DENSITY INTEGRATED CIRCUIT", in U.S. Pat. No. 6,346,834, entitled "POWER ON RESET CIRCUIT" and in KR Publication No. 2002-31843, entitled "POWER-UP CIRCUIT".

FIG. 1 is a schematic block diagram of a semiconductor integrated circuit device with a conventional power-on reset circuit; and FIG. 2 is a graphic diagram illustrating an output signal of a power-on reset circuit shown in FIG. 1.

Referring to FIG. 1, the semiconductor integrated circuit device 10 includes a power-on reset (POR) circuit 20 and an internal circuit 30. The internal circuit 30 may be a conventionally-known integrated circuit which includes a switch SW, a latch LAT1 and a PMOS transistor M1. The switch SW includes a transmission gate TG1 receiving an input signal IN and a clock signal CLK to output a signal to the latch LAT1, and an inverter INV1 which receives the CLK at an input and outputs an inverted CLK signal to the transmission gate TG1. Latch LAT1 includes inverters INV2 and INV3, which receive the signal generated from TG1 of switch SW in order to generate an output signal OUT from the internal circuit 30. The latch LAT1 in the internal circuit 30 is initialized by an output signal VCCH of the POR circuit 20 at a power-on of the device 10. As illustrated in FIG. 2, when a power supply voltage VCC reaches a specified voltage Va during power-on, the output signal VCCH transitions from a low level to a high level. The latch LAT1 is initialized during an initialization interval. The duration of the initialization interval extends from a first time instant, when the power supply voltage VCC reaches a threshold voltage Vth of the PMOS transistor M1, to a second time instant when the power supply voltage VCC reaches the specified voltage Va.

The POR circuit 20 may be embodied, for example, by a differential amplifier, as illustrated in FIG. 2 of the above-noted '347 patent. The differential amplifier disclosed in the patent '347 generates a start-up signal transition at a specific time, regardless of a temperature variation. Even though the start-up signal transitions at a constant point of time despite the variations in temperature, the following problems may arise if an operation voltage or a power supply voltage becomes substantially low or is at a substantially low voltage.

In the following example, the output signal VCCH transitions from a low level to a high level when a power supply voltage VCC reaches 1.2V, a threshold voltage Vth of the MOS transistor is 0.5V, and the initial power supply voltage VCC is 0.7V. Accordingly, the PMOS transistor M1 in the internal circuit 30 of FIG. 1 is turned on only in a range of 0.5V to 0.7V. The turning-on range of the PMOS transistor M1 represents an initialization interval. The duration of the initialization interval is shortened if a rising gradient of the power supply voltage VCC is substantially sharp. In other words, this means that the start-up operation may not be performed in a normal manner. That is, as the power-supply voltage VCC decreases, it becomes increasingly difficult to adequately secure the initialization interval of the start-up signal.

SUMMARY OF THE INVENTION

An exemplary embodiment of the present invention is directed to an semiconductor integrated circuit device which may include an internal circuit and a power-on reset circuit. The power-on reset circuit receives a power supply voltage and generates a power-on reset signal for initializing the internal circuit at a power-on of the device. At the power-on of the device, the power-on reset circuit may delay a transition of the power-on reset signal from a first level to a second level until a given time duration after the power supply voltage reaches a detection voltage.

Another exemplary embodiment of the present invention is directed to a power-on reset circuit. The power-on reset circuit may include a voltage detector circuit for detecting, at a power-on, whether a power supply voltage reaches a detection voltage to generate a detection signal, and a delay circuit for delaying the detection signal for a given time. The power-on reset circuit may further include a pulse generator circuit for generating a pulse signal in response to a transition of the detection signal, and a power-on reset signal generator circuit for generating the power-on reset signal in response to the pulse signal and an output signal of the delay output circuit.

Another exemplary embodiment of the present invention is directed to a power-on reset circuit. The power-on reset circuit may include a reference voltage generator circuit for receiving a power supply voltage to generate a reference voltage, and a voltage detector circuit for detecting whether the power supply voltage reaches a detection voltage to generate a detection signal. The power-on reset circuit may further include a delay circuit for delaying the detection signal, a pulse generator circuit for generating a pulse signal in response to a transition of the detection signal, and a power-on reset signal generator circuit for generating a power-on reset signal in response to the pulse signal and an output signal of the delay circuit.

Another exemplary embodiment of the present invention is directed to a power-on reset circuit receiving a power supply voltage and generating a power-on reset signal for initializing an internal circuit operatively attached thereto at a power-on. At the power-on, the power-on reset circuit delays a transition of the power-on reset signal from a first level to a second level until a given time duration after the power supply voltage has reached a detection voltage.

Another exemplary embodiment of the present invention is directed to a method of generating a power-on reset signal in a power-on reset circuit so as to secure an initialization interval for an internal circuit attached thereto. In the method, it is detected, at a power-on, whether a power supply voltage reaches a detection voltage to generate a detection signal. The detection signal may be delayed for a given time to output a delayed version of the detection signal. A pulse signal may be generated in response to a transition of the detection signal, and the power-on reset signal maybe generated in response to the pulse signal and the delayed version of the detection signal.

BRIEF DESCRIPTION OF THE DRAWINGS

Exemplary embodiments of the present invention will become more fully understood from the detailed description given herein below and the accompanying drawings, wherein like elements are represented by like reference numerals, which are given by way of illustration only and thus do not limit the exemplary embodiments of the present invention and wherein.

DETAILED DESCRIPTION OF THE EXEMPLARY EMBODIMENTS

The present invention will be described more fully hereinafter with reference to the accompanying drawings, in which exemplary embodiments of the invention are shown.

Figure 3:
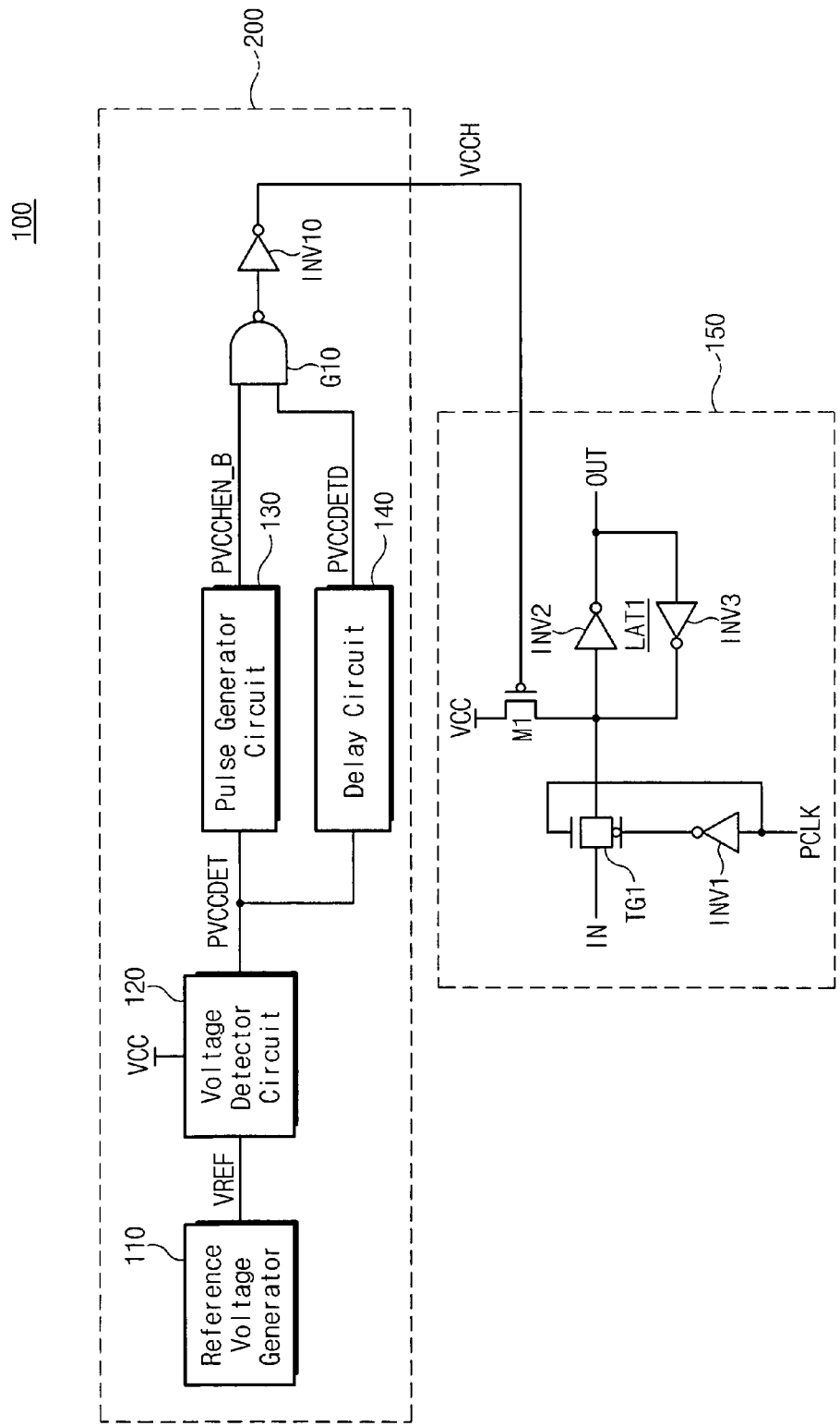
FIG. 3 is a block diagram illustrating a semiconductor integrated circuit device including a power-on reset circuit according to an exemplary embodiment of the present invention.

FIG. 3 is a block diagram illustrating a semiconductor integrated circuit device according to an exemplary embodiment of the present invention. Referring to FIG. 3, the semiconductor integrated circuit device 100 may include a power-on reset circuit 200 for initializing an internal circuit 150. The power-on rest circuit 200 may include a reference voltage generator circuit 110, a voltage detector circuit 120, a pulse generator circuit 130, a delay circuit 140, a NAND gate G10, and an inverter INV10, for example.

Figure 1:
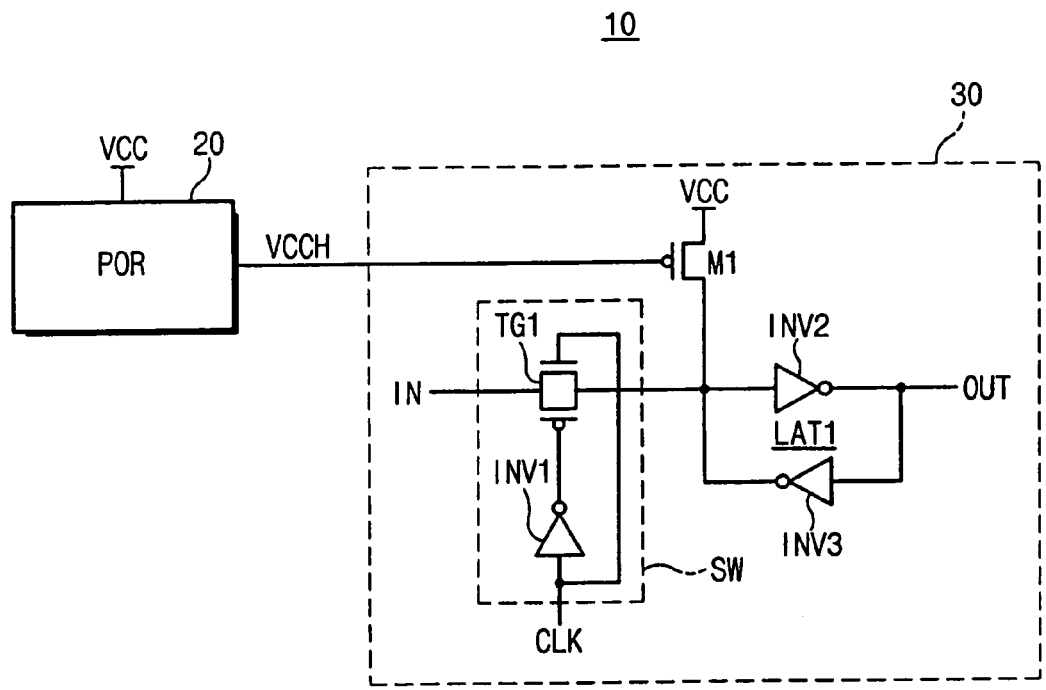
FIG. 1 is a block diagram illustrating a semiconductor integrated circuit device with a conventional power-on reset circuit.
Figure 2:
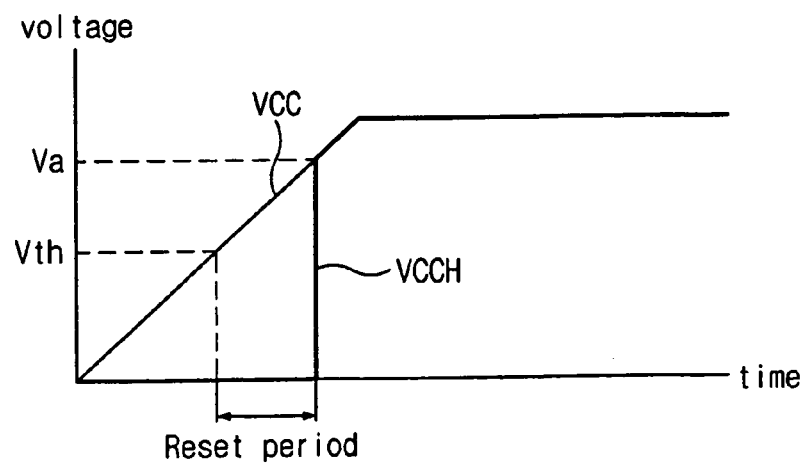
FIG. 2 is a graphic diagram illustrating an output signal of a power-on reset circuit shown in FIG. 1.

The internal circuit 150 of FIG. 3 is the same as the internal circuit 30 illustrated in FIG. 1, and the reference numbers corresponding to elements discussed with respect to FIG. 1 refer to like elements with respect to the internal circuit 150 of FIG. 3. However, the internal circuit 150 is not limited to what is illustrated in FIG. 3. For example, the internal circuit 150 may be configured to set an output of latch LAT1 to a low level with an inverted version of a power-on reset signal VCCH. Alternatively, the internal circuit 150 may be adapted to operate with reset registers, counters and flip-flops that are known in the art, for example.

Referring to FIG. 3, the reference voltage generator circuit 110 receives a power supply voltage and generates a reference voltage VREF. The reference voltage generator circuit 110 may generate a reference voltage VREF that is dull (or insensitive) to temperature, power supply voltage and process variations. An exemplary reference voltage generator circuit 110 is disclosed in U.S. Pat. No. 6,528,978 entitled "REFERENCE VOLTAGE GENERATOR", the entire contents of which are hereby incorporated by reference.

The voltage detector circuit 120 is provided with a power supply voltage VCC and a reference voltage VREF. The voltage detector circuit 120 detects whether the power supply voltage VCC is higher than the reference voltage VREF and outputs a detection signal PVCCDET at either a high level or a low level based on the detection result. For example, when the power supply voltage VCC is lower than the reference voltage VREF, the detection signal PVCCDET is output at a low level. If the power supply voltage VCC is higher than the reference voltage VREF, the detection signal PVCCDET is output at a high level of the power supply voltage. When the power supply voltage VCC is the same as or higher than the reference voltage VREF, the voltage level of the detection signal PVCCDET varies according to the power supply voltage. Accordingly, when the power supply voltage VCC reaches the reference voltage VREF, the power supply voltage VCC may be considered as having reached a 'detection voltage'. Hereafter, detection voltage may be occasionally be referred to instead of reference voltage VREF.

Figure 4:
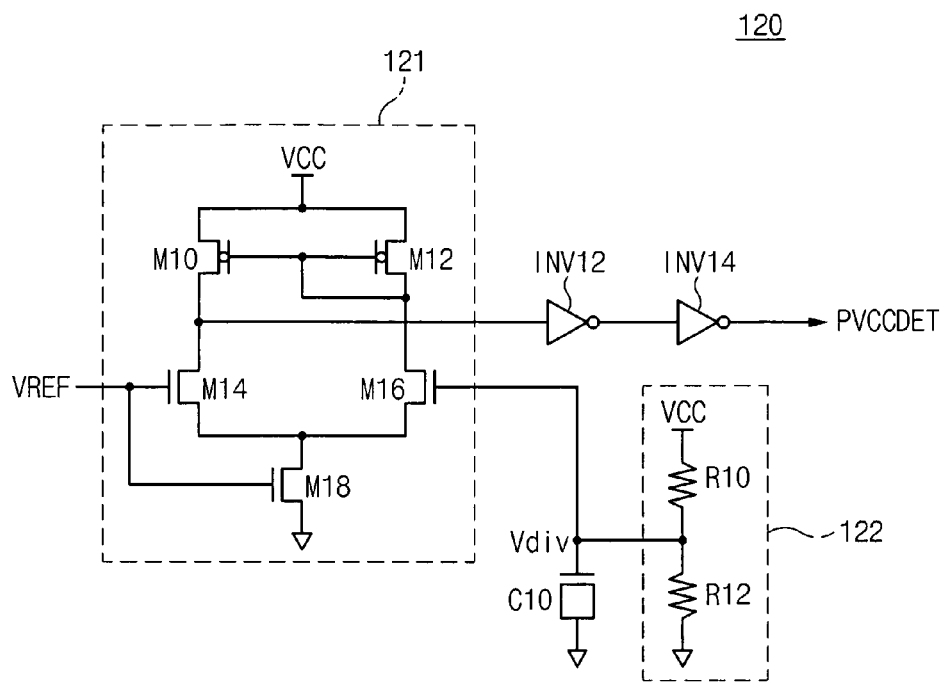
FIG. 4 is a circuit diagram illustrating a voltage detector circuit shown in FIG. 3 according to an exemplary embodiment of the present invention.

FIG. 4 is a circuit diagram illustrating a voltage detector circuit 120 of FIG. 3 according to an exemplary embodiment of the present invention. The voltage detector circuit 120 may include a differential amplifier 121 composed of PMOS transistors M10 and M12 and NMOS transistors M14, M16 and M18, which may be connected as shown in FIG. 4.

The voltage detector circuit 120 may include a voltage divider 122 comprised of resisters R10 and R12 connected in series between the power supply voltage VCC and the ground voltage. The voltage detector circuit 120 divides the power supply voltage VCC to output a distribution voltage Vdiv.

The voltage detector circuit 120 may include a capacitor C10, Capacitor C10 is connected to a gate of an input transistor M16 of the differential amplifier 121 and acts as a load on input transistor M16. As a result, a loading of the gate of the input transistor M16 is greater than a loading of the input transistor M14. In other words, a rising gradient of a voltage supplied to the input transistor M14 is sharper than a rising gradient of a voltage provided to the input transistor M16. That is, input voltages of the input transistors M14 and M16 may vary with different gradients.

The voltage detector circuit 120 may further include inverters INV12 and INV14. INV12 inverts an output from differential amplifier 121, and INV14 inverts the inverted output from INV12 to output the detection signal PVCC-DET, as shown in FIG. 4.

Figure 5:
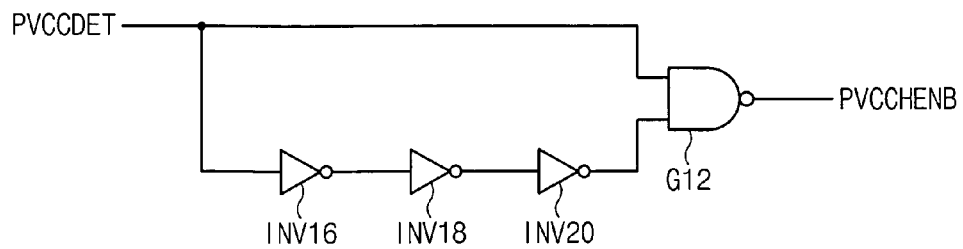
FIG. 5 is a circuit diagram illustrating a pulse generator circuit shown in FIG. 3 according to an exemplary embodiment of the present invention.

FIG. 5 is a circuit diagram illustrating the pulse generator circuit 130 of FIG. 3 according to an exemplary embodiment of the present invention. Referring back to FIG. 3, the pulse generator circuit 130 receives the detection signal PVCC-DET and generates an active low pulse signal PVCCHENB. As shown in FIG. 5, the pulse generator circuit 130 may include inverters INV16, INV18 and INV20 and a NAND gate G12.

When the detection signal PVCCDET is received at a low level, the pulse signal PVCCHENB follows the power supply voltage VCC. When the detection signal PVCCDET transitions from a low level to a high level, the pulse signal PVCCHENB transitions to a low level and is maintained at the low level for a given duration of time. For example, at a power-on, when the detection signal PVCCDET is at a low level, a voltage level of the pulse signal PVCCHENB varies in accordance with the power supply voltage VCC, as discussed above. When the detection signal PVCCDET is transiting from a low level to a high level (i.e., a low-high transition), the voltage level of the pulse signal PVCCHENB assumes a voltage level of the ground voltage (e.g., low level). After a given duration of time has elapsed, the voltage level of the pulse signal PVCCHENB begins to vary again in accordance with the power supply voltage VCC.

The delay circuit 140 delays the detection signal PVCC-DET outputted from the voltage detector circuit 120, and the NAND gate G10 receives output signals PVCCHENB and PVCCDETD of the pulse generator circuit 130 and the delay circuit 140. The inverter INV10 receives an output signal from NAND gate G10 and outputs a power-on reset signal VCCH.

The power-on reset circuit 200 maintains the power-on reset signal VCCH at a low level until the power supply voltage VCC reaches the reference voltage VREF as a detection voltage (e.g., an activation interval of the pulse signal) and a given time elapses. The given time corresponds to an activation interval of the pulse signal. During a low level interval of the power-on reset signal VCCH, a latch of the internal circuit 150 is initialized. Accordingly, the power-on reset signal VCCH may be continuously maintained at a low voltage level during a given time period or interval after the power supply voltage VCC reaches the reference voltage VREF (detection voltage), such that an acceptable initialization interval can be ensured.

Therefore, even if a rising gradient of the power supply voltage VCC is substantially sharp (as the power supply voltage VCC increases from a substantially low voltage to VREF), a normal start-up operation may be performed. This is possible since the reset signal VCCH is continuously maintained at a low voltage level, which may adequately secure the initialization interval of the start-up signal.

FIGS. 6A through 6F show waveforms of internal signals of the power-on reset circuit 200 of FIG. 3. A method of operating the power-on reset circuit 200 according to an exemplary embodiment of the present invention will be explained with reference to FIGS. 6A through 6F. The following discussion describes an improved initializing operation performed by the power-on reset circuit 200 to achieve a sufficient initialization interval for an internal circuit 150, and more specifically for latch LAT1 in the internal circuit 150.

Figure 6:
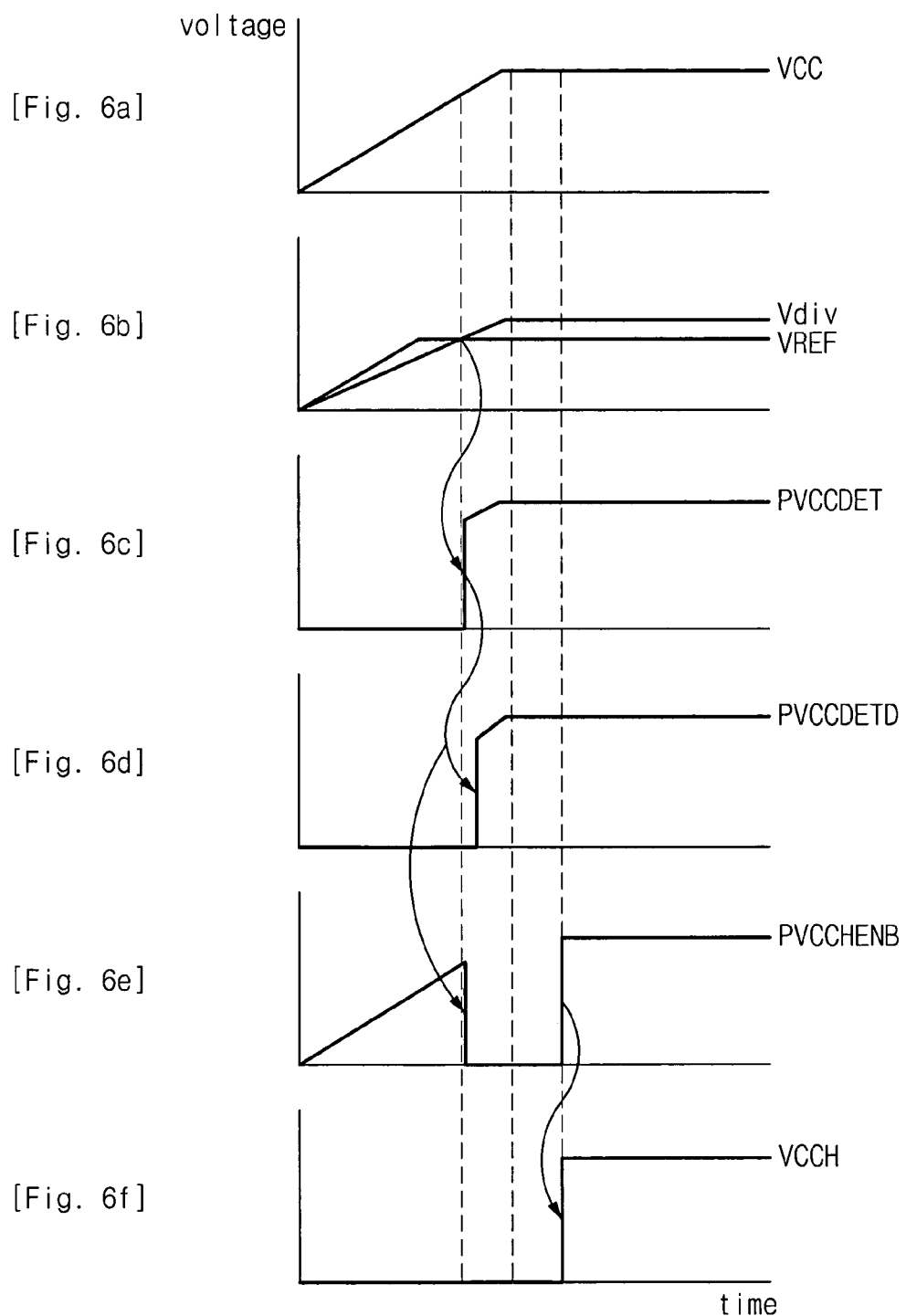
FIGS. 6A–6F are graphic diagram illustrating waveforms of internal signals used in the power-on reset circuit shown in FIG. 3.

As illustrated in FIG. 6A, at a power-on, the power supply voltage VCC increases with a specific gradient. As known in the art, the rising gradient of the power supply voltage VCC may be sharp or gentle depending on mounting conditions of semiconductor integrated circuit devices. The mounting conditions relate to the way circuits are mounted on the printed circuit board, which may affect the rising gradient of the power supply voltage VCC. The reference voltage generator circuit 110 generates a reference voltage VREF that may vary in accordance with the power supply voltage VCC, as the power supply voltage VCC is being applied to the semiconductor integrated circuit device.

At the same time the power supply voltage VCC is being applied to the semiconductor integrated circuit device, the voltage divider 122 divides the power supply voltage VCC to generate the distribution voltage Vdiv. The rising gradient of the distribution voltage Vdiv may be gentler than the rising gradient of the reference voltage, as illustrated in FIG. 6B, for example, and may be determined by capacitor C10 serving as a load.

Referring to FIG. 6C, at a point where the distribution voltage Vdiv becomes higher than the reference voltage VREF, the voltage detector circuit 120 outputs a detection signal PVCCDET of a low level. For example, as the power supply voltage VCC continuously increases, the distribution voltage Vdiv rises to equal the reference voltage VREF. At this point, as illustrated in FIG. 6C, the detection signal PVCCDET transitions from a low level to a high level. The high level detection signal PVCCDET assumes the power supply voltage VCC (see also FIG. 6A). As illustrated in FIG. 6D, the delay circuit 140 slightly delays the detection signal PVCCDET transition from a low level to a high level.

Referring to FIG. 6E, and before the detection signal PVCCDET transitions from a low level to a high level, the pulse signal PVCCHENB from the pulse generator circuit 130 varies based on the power supply voltage VCC. Referring to FIG. 6F, at the time the pulse signal PVCCHENB output from the pulse generator circuit 130 transitions to a low level (see FIG. 6E), the power-on reset signal VCCH output from the power-on reset circuit 200 is maintained at a low level. VCCH is maintained at a low level because one input signal of the NAND gate G10 is maintained at a low level. When the distribution voltage Vdiv reaches a reference voltage VREF (see FIG. 6B) and the detection signal PVCCDET transitions from a low level to a high level (see FIG. 6C), the pulse signal PVCCHENB output from the pulse generator circuit 130 becomes a low level, as shown in FIG. 6E for example.

Even though the detection signal PVCCDET is at a high level, the power-on reset signal VCCH is maintained at a low level because the input signals to NAND gate G10 (e.g., PVCCDETD and PVCCHENB) are maintained at a low level, as shown in FIGS. 6D and 6e. After a given duration of time, the pulse signal PVCCHENB transitions from a low level to a high level. This means that the power-on reset signal VCCH transitions from a low level to a high level. While the power-on reset signal VCCH is still being maintained at a low level by the power-on reset circuit 200, a latch LAT1 of the internal circuit 150 is initialized through PMOS transistor M1. The power-on reset circuit 200 thus generates a power-on reset signal VCCH that remains at a low level for a given period of time to provide an efficient initialization interval for initializing latch LAT1 of the internal circuit 150.

The power-on reset circuit 200 in accordance with the exemplary embodiments of the present invention may also perform an initializing operation when the power supply voltage VCC decreases. The following describes an improved method for providing a adequate initialization interval for initializing latch LAT1 of the internal circuit 150 when the power supply voltage VCC decreases or is substantially low.

In this example, the power supply voltage VCC is 1.2V, a threshold voltage Vth of the MOS transistor is 0.5V, and a power-on reset signal VCCH has a low-high transition at a power supply voltage of 0.7V. A turn-on interval (i.e., initialization interval) of PMOS transistor M1 initializing the latch LAT1 may be set in a range of about 0.5V to 0.7V. These are only exemplary voltage levels, the exemplary embodiments are applicable to other voltage levels as well.

When the rising gradient of the power supply voltage provided (this gradient may be set different according to the mounting environment as described above) is sharp and the power supply voltage VCC is low, the initialization interval of the internal circuit 150 becomes truncated or shortened. That is, it may become difficult to secure an adequate initialization interval for initializing the internal circuit 150.

However, the power-on reset circuit 200 prevents the power-on reset signal VCCH transition from a lower level to a high level until a given time has elapsed after the power supply voltage VCC has reached a voltage level capable of turning on the PMOS transistor M1. Therefore, even if the rising gradient of the power supply voltage VCC is sharp and the power supply voltage VCC is substantially low, an adequate initialization interval for initializing the internal circuit 150 may be efficiently secured by means of an controlling the activation interval of the pulse signal PVCCHENB output from pulse generator circuit 130. After a given duration of time (e.g., the activation interval), the pulse signal PVCCHENB transitions from a low level to a high level (see FIG. 6E), which enables the power-on reset signal VCCH transition to be maintained at a low level long enough to enable the PMOS transistor M1 to be turned on even after the power supply voltage VCC reaches a full VCC level.

As described above, the power-on reset circuit 200 according to the exemplary embodiments of the present invention maintains the power-on reset signal at a low level until the power supply voltage VCC reaches reference voltage VREF and a given time elapses. Therefore, even if a rising gradient of the power supply voltage VCC is sharp and the power supply voltage is substantially low, a sufficient initialization interval may be secured for internal circuit 150.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A semiconductor integrated circuit device, comprising:
an internal circuit; and
a power-on reset circuit receiving a power supply voltage and generating a power-on reset signal for initializing the internal circuit at power-on of the device,
wherein, at power-on and as the power supply voltage has reached a detection voltage, the power-on reset circuit generates a detection signal which transitions from an existing low level to a high level, and generates a pulse signal at a low level in response to the low-to-high detection signal transition, so as to delay a transition of the power-on reset signal from an existing low level to a high level for a duration of the pulse signal.

2. The device of claim 1, wherein
the internal circuit includes at least one latch, and
the delay of the power-on reset signal transition enables a desired sufficient initialization interval to be secured for initializing the at least one latch.

3. The device of claim 1, wherein
the internal circuit includes at least one MOS transistor, and
the detection voltage is greater than a threshold voltage of the at least one MOS transistor and less than the power supply voltage.

4. The device of claim 1, wherein the power-on reset circuit includes:
a voltage detector circuit for detecting, at power-on, whether the power supply voltage has reached the detection voltage, so as to generate the detection signal;
a pulse generator circuit for generating the low level pulse signal in response to the low-to-high transition of the generated detection signal; and
a power-on reset signal generator circuit for generating the power-on reset signal based on the pulse signal and a delayed version of the detection signal.

5. The device of claim 4, wherein the voltage detector circuit includes:
a voltage divider for dividing the power supply voltage; and
a differential amplifier for generating the detection signal when an output voltage of the voltage divider is greater than a reference voltage input to the differential amplifier.

6. The device of claim 5, wherein the differential amplifier includes:
a first input terminal for receiving the output voltage of the voltage divider, and
a second input terminal for receiving the reference voltage, wherein loading of the first input terminal is larger than loading of the second input terminal.

7. A power-on reset circuit, comprising:
a voltage detector circuit for detecting, at a power-on, whether a power supply voltage has reached a detection voltage, so as to generate a detection signal;
a delay circuit for delaying the detection signal for a given time to generate a delayed detection signal;
a pulse generator circuit for generating a pulse signal at a low level in response to a low-to-high level transition of the detection signal; and
a power-on reset signal generator circuit for generating a power-on reset signal in response to the pulse signal and the delayed detection signal, the power-on reset signal being maintained at a low level for a duration of the pulse signal.

8. The circuit of claim 7, wherein the power-on reset signal follows the power supply voltage after the low-to-high detection signal transition and after the duration of the low level pulse signal has elapsed.

9. The circuit of claim 7, wherein the detection voltage is greater than a threshold voltage of a MOS transistor in an internal circuit operatively connected to the power-on reset circuit and less than the power supply voltage.

10. The circuit of claim 7, wherein the voltage detector circuit includes:
a voltage divider for dividing the power supply voltage; and
a differential amplifier for generating the detection signal when an output voltage of the voltage divider is greater than a reference voltage input to the differential amplifier.

11. The circuit of claim 10, wherein the differential amplifier includes:
   a first input terminal for receiving the output voltage of the voltage divider, and
   a second input terminal for receiving the reference voltage, wherein loading of the first input terminal is greater than loading of the second input terminal.

12. A power-on reset circuit, comprising:
   a reference voltage generator circuit for receiving a power supply voltage and generating a reference voltage;
   a voltage detector circuit for effectively comparing the power supply voltage to the reference voltage and generating a detection signal when a distribution voltage related to the power supply voltage reaches the reference voltage;
   a delay circuit for delaying the detection signal to generate a delayed detection signal;
   a pulse generator circuit for generating a pulse signal at a low level in response to a low-to-high level transition of the detection signal; and
   a power-on reset signal generator circuit for generating a power-on reset signal in response to the pulse signal and the delayed detection signal, the power-on reset signal being maintained at a low level for a duration of the pulse signal.

13. The circuit of claim 12, wherein the power-on reset signal follows the power supply voltage after the low-to-high detection signal transition and after the duration of the pulse signal has elapsed.

14. The circuit of claim 12, wherein the detection voltage is greater than a threshold voltage of a MOS transistor in an internal circuit operatively connected to the power-on reset circuit and less than the power supply voltage.

15. The circuit of claim 12, wherein the voltage detector circuit includes:
   a voltage divider for dividing the power supply voltage to output the distribution voltage; and
   a differential amplifier for generating the detection signal when the distribution voltage reaches the reference voltage.

16. A method of generating a power-on reset signal in a power-on reset circuit so as to secure an initialization interval for an internal circuit attached thereto, comprising:
   detecting, at a power-on, whether a power supply voltage has reached a detection voltage, so as to generate a detection signal;
   delaying the detection signal for a given time to output a delayed version of the detection signal;
   generating a pulse signal at a low level in response to a low-to-high level transition of the detection signal; and
   generating the power-on reset signal in response to the pulse signal and the delayed version of the detection signal, the power-on reset signal being maintained at a low level for a duration of the pulse signal.

17. The method of claim 16, wherein the power-on reset signal follows the power supply voltage after the low-to-high detection signal transition and after the duration of the pulse signal has elapsed, so as to ensure an adequate initialization interval for the internal circuit.

* * * * *